US008334599B2

(12) United States Patent
Bruennert et al.

(10) Patent No.: US 8,334,599 B2
(45) Date of Patent: Dec. 18, 2012

(54) ELECTRONIC DEVICE HAVING A CHIP STACK

(75) Inventors: Michael Bruennert, Munich (DE); Ullrich Menczigar, Vaterstetten (DE); Christian Mueller, Taufkirchen (DE); Sitt Tontosirin, Munich (DE); Hermann Ruckerbauer, Moos (DE)

(73) Assignee: Qimonda AG, Munich (DE)

( * ) Notice: Subject to any disclaimer, the term of this patent is extended or adjusted under 35 U.S.C. 154(b) by 1154 days.

(21) Appl. No.: 12/196,215

(22) Filed: Aug. 21, 2008

(65) Prior Publication Data

US 2010/0044877 A1 Feb. 25, 2010

(51) Int. Cl.
*H01L 23/538* (2006.01)

(52) U.S. Cl. . 257/777; 257/686; 257/774; 257/E23.174; 257/E23.175

(58) Field of Classification Search .................. 257/777, 257/686, 774, E23.174, E23.175
See application file for complete search history.

(56) References Cited

U.S. PATENT DOCUMENTS 5,473,196 A * 12/1995 De Givry ...................... 257/786
6,271,587 B1 * 8/2001 Patti ............................. 257/724
7,321,164 B2 * 1/2008 Hsu .............................. 257/686
7,598,607 B2 * 10/2009 Chung et al. .................. 257/686
7,598,617 B2 * 10/2009 Lee et al. ...................... 257/777
7,605,019 B2 * 10/2009 Simon et al. .................. 438/109
7,638,869 B2 * 12/2009 Irsigler et al. ................. 257/686
7,698,470 B2 * 4/2010 Ruckerbauer et al. .......... 710/14
7,701,045 B2 * 4/2010 Ware et al. .................... 257/686
7,795,139 B2 * 9/2010 Han et al. ...................... 438/639
7,800,238 B2 * 9/2010 Pratt ............................ 257/777
7,808,105 B1 * 10/2010 Paek ............................ 257/750
7,824,960 B2 * 11/2010 Hao et al. ..................... 438/109
7,834,450 B2 * 11/2010 Kang ........................... 257/724
7,838,967 B2 * 11/2010 Chen ........................... 257/621
7,880,309 B2 * 2/2011 Pilla ............................. 257/777
7,883,938 B2 * 2/2011 Kolan et al. ................... 438/109
7,902,643 B2 * 3/2011 Tuttle ........................... 257/659
7,902,674 B2 * 3/2011 Chang et al. .................. 257/777
7,915,710 B2 * 3/2011 Lee et al. ...................... 257/621
7,989,265 B2 * 8/2011 Ware et al. .................... 438/109
2005/0146049 A1 * 7/2005 Kripesh et al. ................ 257/776
2005/0205968 A1 * 9/2005 Kim ............................. 257/621
2007/0222050 A1 * 9/2007 Lee et al. ...................... 257/678
2007/0222054 A1 * 9/2007 Hembree ...................... 257/686
2007/0235851 A1 * 10/2007 Ware et al. .................... 257/678
2007/0246257 A1 10/2007 Muff et al.
2007/0281374 A1 * 12/2007 Lee et al. ........................ 438/14
2008/0029850 A1 * 2/2008 Hedler et al. ................. 257/621
2008/0032448 A1 * 2/2008 Simon et al. .................. 438/107
2008/0054444 A1 * 3/2008 Tuttle ........................... 257/698
2008/0088031 A1 * 4/2008 Kwon et al. .................. 257/777
2008/0237891 A1 * 10/2008 Irsigler et al. ................ 257/778
2008/0290492 A1 * 11/2008 Chung et al. .................. 257/686
2008/0318361 A1 * 12/2008 Han et al. ...................... 438/109

(Continued)

FOREIGN PATENT DOCUMENTS

DE 102006017947 10/2007

*Primary Examiner* — David Vu
*Assistant Examiner* — Earl Taylor
(74) *Attorney, Agent, or Firm* — Patterson & Sheridan, LLP

(57) ABSTRACT

An electronic device provides a stack of semiconductor chips. A redistribution layer of a first semiconductor chip is arranged at the bottom of the stack. The redistribution layer of the first semiconductor chip comprises external pads.

19 Claims, 5 Drawing Sheets

U.S. PATENT DOCUMENTS

2009/0001602 A1* 1/2009 Chung .......................... 257/777
2009/0014891 A1* 1/2009 Chang et al. .................. 257/777
2009/0032966 A1* 2/2009 Lee et al. ...................... 257/774
2009/0130798 A1* 5/2009 Ware et al. .................... 438/107
2009/0261476 A1* 10/2009 Huang et al. .................. 257/766
2009/0267194 A1* 10/2009 Chen ............................. 257/621
2009/0283898 A1* 11/2009 Janzen et al. ................. 257/698
2009/0302435 A1* 12/2009 Pagaila et al. ................. 257/659
2009/0321947 A1* 12/2009 Pratt ............................. 257/777
2010/0044877 A1* 2/2010 Bruennert et al. ............ 257/777
2010/0047964 A1* 2/2010 Farooq et al. ................. 438/107

* cited by examiner

ELECTRONIC DEVICE HAVING A CHIP STACK

FIELD

The present invention relates to an electronic device comprising a stack of semiconductor chips, as well as to a method for designing an integrated circuit.

BACKGROUND

Chip stacks comprising a plurality of integrated semiconductor circuit dies arranged above each other are a way of increasing device densities of, for example, random access memory devices. Conventionally, such chip stacks may be implemented by adding additional redistribution layers to the individual semiconductor dies and wirebonding each individual semiconductor die. This may add additional capacitances and parasitics. Additionally, the redistribution layers and wirebond connections may require additional space at the edges of the individual semiconductor dies. Furthermore, integrated circuit dies designed for stand-alone use may not easily be utilized in a chip stack but may require major layout changes and a full-level re-design.

SUMMARY

The electronic device provides a stack of semiconductor chips. A redistribution layer of a first semiconductor chip is arranged at the bottom of the stack. The redistribution layer of the first semiconductor chip has external pads.

The method for designing an integrated circuit provides steps of providing a position for an internal pad for an electronic signal in a last metallic layer of the integrated circuit design and providing a place holder for a Through Silicon Via in the integrated circuit design.

BRIEF DESCRIPTION OF THE DRAWINGS

The above recited features of the present invention will become clear from the following description taking in conjunction with the accompanying drawings in which like reference numerals identify like elements. It is to be noted however, that the accompanying drawings illustrate only typical embodiments of the present invention and are therefore not to be considered limiting of the scope of the invention. The present invention may admit other equally effective embodiments. The present invention will be described below in more details with reference to the embodiments and drawings.

DETAILED DESCRIPTION

Figure 1:
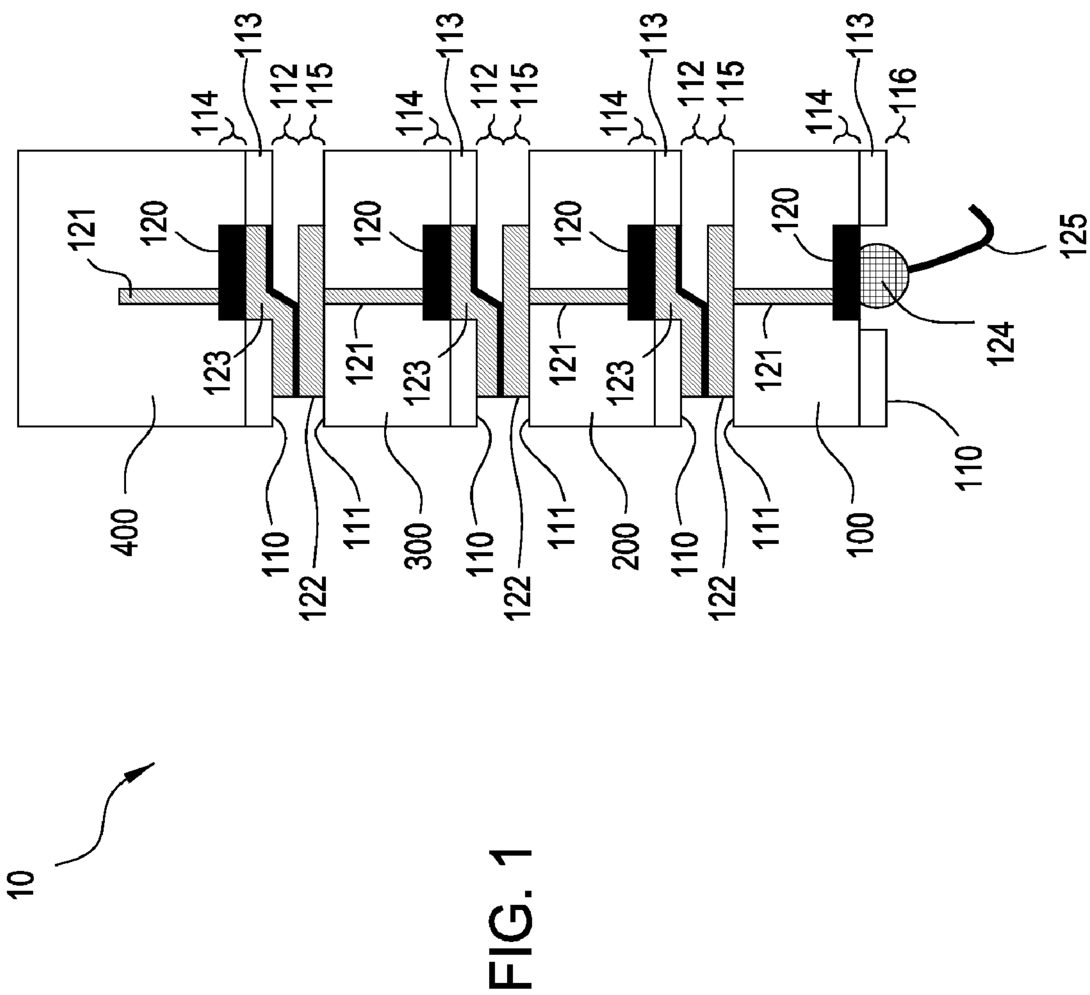
FIG. 1 schematically shows a section of a chip stack.

FIG. 1 schematically depicts a section of a chip stack 10. The chip stack 10 may be a random access memory device. The chip stack 10 may, for example, be a multi rank memory device, for example a quad rank memory device.

The chip stack 10 depicted in FIG. 1 comprises a stack of four dies, a first die 100, a second die 200, a third die 300 and a fourth die 400. The number of individual dies in the chip stack 10 may as well be lower or higher than four. The dies 100, 200, 300, 400 of the chip stack 10 are arranged one above another, thereby forming a stack that extends axially in a given direction. A front side 110 of the first die 100 constitutes a lower end of the chip stack 10. A front side 110 of the second die 200 is arranged above a backside 111 of the first die 100. A front side 110 of the third die 300 is arranged above a backside 111 of the second die 200. A front side 110 of the fourth die 400 is arranged above a backside 111 of the third die 300.

Each die 100, 200, 300, 400 comprises a first internal pad 120 defined in a last (lowermost) metallic layer 114 of the respective die 100, 200, 300, 400. The first internal pad 120 of each die 100, 200, 300, 400 is electrically connected to an electronic circuit integrated in the respective die 100, 200, 300, 400. Each first internal pad 120 may be used to couple an electronic signal in the electronic circuit of the respective die 100, 200, 300, 400 or out of the electronic circuit of the respective die 100, 200, 300, 400. The electronic signal may for example be a control signal or a data signal. The electronic signal may for example be a column address signal, a clock signal, a reset signal, a reference voltage signal or a power supply signal.

The last metallic layer 114 of each die 100, 200, 300, 400 is covered by an insulator layer 113 constituting the front side 110 of each respective die 100, 200, 300, 400. The insulator layer 113 of each die 100, 200, 300, 400 may for example comprise an oxide or a nitride. At the location of the internal pad 120, the insulator layer 113 of each die 100, 200, 300, 400 forms an opening that gives access to the internal pad 120 from the front side 110 of the respective die 100, 200, 300, 400.

The second, the third and the fourth die 200, 300, 400 each comprise a first redistribution layer 112 disposed on, and covering at least a portion of, the insulator layer 113 of each respective die 200, 300, 400. The first redistribution layer 112 of each die 200, 300, 400 comprises a first front contact pad 123 that extends into the openings formed by each insulator layer 113, to provide electrical contact to the internal pad 120 of each respective die 200, 300, 400. That is, each first redistribution layer 112 includes a first portion that is disposed on the front sides of the respective insulator layer 113, and a second portion that is disposed in the respective opening formed by the respective insulator layer 113.

The first die 100 of the chip stack 10 comprises a second redistribution layer 116. The second redistribution layer 116 of the first die 100 may be identical to the first redistribution layers 112 of the second, third and fourth dies 200, 300, 400. The second redistribution layer 116 of the first die 100 may also be different than the first redistribution layers 112 of the second, third and fourth dies 200, 300, 400. In the section of the chip stack 10 depicted in FIG. 1, the second redistribution layer 116 of the first die 100 does not comprise a front contact pad.

The first and second redistribution layers 112, 116 may comprise metal. In the scope of this application, however, they do not count as metallic layers. The last metallic layer 114 therefore is the last metallic layer before the redistribution layers 112, 116.

The respective backsides 111 of the first, the second and the third die 100, 200, 300 each comprise a backside interconnect layer 115. The backside interconnect layers 115 of the first, second and third dies 100, 200 and 300 each comprise a first back contact pad 122 being in electrical contact with the first front contact pad 123 of the respective adjacent upper die 200, 300, 400. The first back contact pad 122 of the first die 100 is in electrical contact with the first front contact pad 123 of the second die 200. The first back contact pad 122 of the second die 200 is in electrical contact with the first front contact pad 123 of the third die 300. The first back contact pad 122 of the third die 300 is in electrical contact with the first front contact pad 123 of the fourth die 400.

The first internal pad 120 of the first die 100 and the first back contact pad 122 of the first die 100 are electrically connected by a first Through Silicon Via 121 extending from the first internal pad 120 of the first die 100 to the first back contact pad 122 of the first die 100 through the first die 100. The first internal pad 120 of the second die 200 and the first back contact pad 122 of the second die 200 are electrically connected by a first Through Silicon Via 121 arranged in the second die 200. The first internal pad 120 of the third die 300 and the first back contact pad 122 of the third die 200 are electrically connected by a first Through Silicon Via 121 arranged in the third die 300.

The first internal pad 120 of the fourth die 400 may be electrically connected to a first Through Silicon Via 121 arranged in the fourth die 400. In this case, the third, second, third and fourth die 100, 200, 300, 400 may each comprise an identical design up to the last metallic layer 114 of the respective die 100, 200, 300, 400. The first Through Silicon Via 121 of the fourth die 400 may also be omitted.

The first Through Silicon Vias 121 of the dies 100, 200, 300, 400 may be arranged below the first internal pads 120 of the respective dies 100, 200, 300, 400.

The first internal pad 120 of the first die 100 is electrically connected to a first bond wire 125 with a first bond 124. The first internal pad 120 of the first die 100 therefore serves as an external pad. The first bond wire 125 electrically connects the chip stack 10 with another device, for example a memory controller. The first bond wire 125 may be used to couple an electronic signal in the dies 100, 200, 300, 400. The electronic signal provided at the first bond wire 125 is applied to all four dies 100, 200, 300, 400 in parallel, according to one embodiment. The first bond wire 125 may as well be utilized to couple an electronic signal out of the chip stack 10. The electronic signal coupled out of the chip stack 10 via the first bond wire 125 may be generated by any of the dies 100, 200, 300, 400.

The first, second and third dies 100, 200, 300 may have been thinned to form the backside 111 of each respective die 100, 200, 300. The first, second and third dies 100, 200 and 300 may have been thinned such that the respective first Trough Silicon Via 121 of each respective die 100, 200, 300 extends up to the backside 111 of each respective die 100, 200, 300. The fourth die 400 may or may not have been thinned as well.

Figures 2, 4:
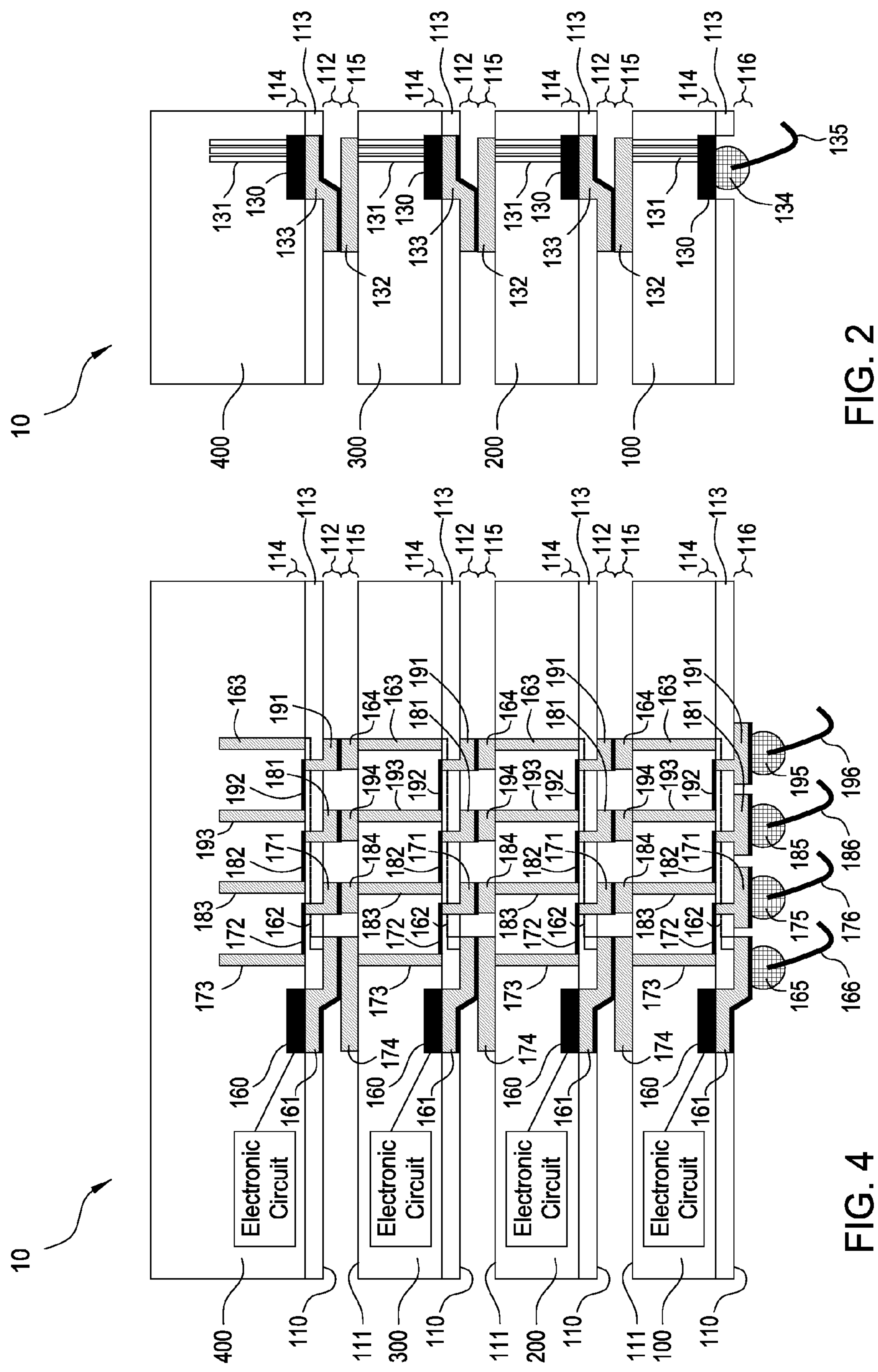
FIG. 2 schematically shows a section of a chip stack.
FIG. 4 schematically shows a section of a chip stack.

FIG. 2 depicts a schematic representation of another section of the chip stack 10. In the section of the chip stack 10 depicted in FIG. 2, each die 100, 200, 300, 400 comprises a second internal pad 130 arranged in the last metallic layer 114 of the respective die 100, 200, 300, 400. The respective insulator layer 113 of each die 100, 200, 300, 400 forms an opening at the location of the respective second internal pad 130 of each die 100, 200, 300, 400, giving access to the respective second internal pad 130 from the respective front side 110 of each die 100, 200, 300, 400.

The second internal pad 130 of each die 100, 200, 300, 400 is electrically connected to an electronic circuit integrated in the respective die 100, 200, 300, 400. Each second internal pad 130 may be used to couple an electronic signal in the electronic circuit of the respective die 100, 200, 300, 400 or out of the electronic circuit of the respective die 100, 200, 300, 400.

The second, the third and the fourth die 200, 300, 400 each comprise a second front contact pad 133 arranged in the respective redistribution layer 112 of each die 200, 300, 400 and extending through the hole in the respective insulator layer 113 of each die 200, 300, 400 to provide electrical contact to the respective second internal pad 130 of each die 200, 300, 400.

The respective back side interconnect layers 115 of the first, the second and the third die 100, 200, 300 each comprise a second back contact pad 132. The respective second internal pads 130 and the respective second back contact pads 132 of the first, second and third dies 100, 200, 300 are electrically connected by second Through Silicon Vias 131 extending between the respective second internal pads 130 and the respective second back contact pads 132 through the respective die 100, 200, 300.

The second internal pad 130 and the second back contact pad 132 of each die 100, 200, 300 may be connected by one or more second Through Silicon Vias 131. If more than one second Through Silicon Via 131 is provided in each die 100, 200, 300, an electrical connection with lower resistance may be achieved. This may decrease electrical dissipation and heat generation.

The second internal pad 130 of the fourth die 400 may be connected to one or more second Through Silicon Vias 131 extending from the second internal pad 130 of the fourth die 400 into the fourth die 400. If the fourth die 400 comprises second Through Silicon Vias 131, all four dies 100, 200, 300, 400 may comprise an identical design up to the respective last metallic layer 114 of each die 100, 200, 300, 400.

The second Through Silicon Vias 131 of the die 100, 200, 300, 400 may be arranged below the second internal pads 130 of the respective die 100, 200, 300, 400.

The second back contact pad 132 of the first die 100 is electrically connected to the second front contact pad 133 of the second die 200. The second back contact pad 132 of the second die 200 is electrically connected to the second front contact pad 133 of the third die 300. The second back contact pad 132 of the third die 300 is electrically connected to the second front contact pad 133 of the fourth die 400. Consequently, the second internal pads 130 of all dies 100, 200, 300, 400 are electrically connected.

The second internal pad 130 of the first die 100 is electrically connected to a second bond wire 135 via a second bond 134. The second internal pad 130 of the first die 100 therefore serves as an external pad. The second bond wire 135 may couple the chip stack 10 to an external electronic device, for example to a memory controller. The second bond wire 135 may be utilized to couple electronic signals in the first, second, third and fourth die 100, 200, 300, 400. The second bond wire 135 may as well be utilized to couple electronic signals out of the first, second, third and fourth die 100, 200, 300, 400. The electronic signals may for example be a power supply or an electrical ground.

Figure 3:
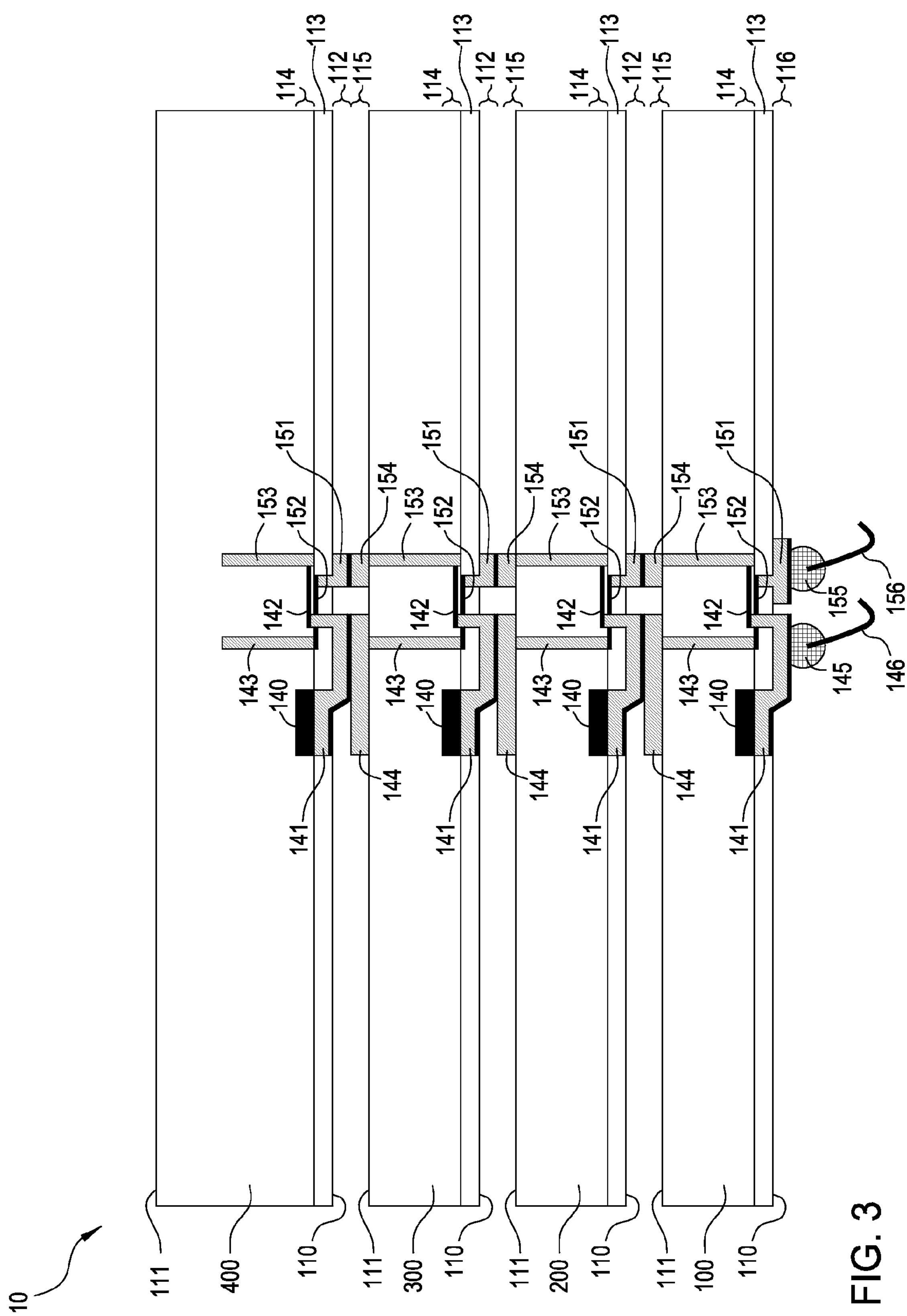
FIG. 3 schematically shows a section of a chip stack.

FIG. 3 schematically depicts another section of the chip stack 10. In the section of the chip stack 10 depicted in FIG. 3, the first, the second, the third and the fourth die 100, 200, 300, 400 each comprise a third internal pad 140 provided in the respective last metallic layer 114 of the respective die 100, 200, 300, 400. Each third internal pad 140 is electrically coupled to an electronic circuit integrated in the respective die 100, 200, 300, 400. The respective insulator layers 113 of each die 100, 200, 300, 400 comprise openings arranged at the locations of the third internal pads 140 of each die 100, 200, 300, 400, providing access to the respective third internal pad 140 from the respective front side 110 of each die 100, 200, 300, 400.

The first redistribution layer 112 arranged on the front side 110 of the second, third and fourth dies 200, 300, 400, and the second redistribution layer 116 of the first die 100 each comprise a third front contact pad 141 and a fourth front contact pad 151. The third front contact pad 141 of each die 100, 200, 300, 400 extends through the respective opening in the respective insulator layer 113 to provide electrical contact to the respective third internal pad 140 of each die 100, 200, 300, 400. The respective third front contact pad 141 of each die 100, 200, 300, 400 is furthermore electrically connected to a respective first redistribution connection 142 arranged in the respective last metallic layer 114 of each die 100, 200, 300, 400. The respective fourth front contact pad 151 of each die 100, 200, 300, 400 is electrically connected to a respective second redistribution connection 152 arranged in the respective last metallic layer 114 of each die 100, 200, 300, 400.

The first, the second and the third die 100, 200, 300 each comprise a third back contact pad 144 and a fourth back contact pad 154 arranged in the respective backside interconnect layer 115 of each die 100, 200, 300.

The first, the second and the third die 100, 200, 300 each comprise a third Through Silicon Via 143 extending through the respective die 100, 200, 300 and electrically connecting the respective second redistribution connection 152 with the third back contact pad 144 of the respective die 100, 200, 300. The first, second and third die 100, 200, 300 each comprise a fourth Through Silicon Via 153 extending trough the respective die 100, 200, 300 and electrically connecting the first redistribution connection 142 with the fourth back contact pad 154 of the respective die 100, 200, 300. The fourth die 400 may as well comprise a third Through Silicon Via 143 electrically connected to the second redistribution connection 152 of the fourth die 400. The fourth die 400 may also comprise a fourth Through Silicon Via 153 electrically connected to the first redistribution connection 142 of the fourth die 400.

The third back contact pad 144 of the first die 100 is electrically connected to the third front contact pad 141 of the second die 200. The fourth back contact pad 154 of the first die 100 is electrically connected to the fourth front contact pad 151 of the second die 200. The third back contact pad 144 of the second die 200 is electrically connected to the third front contact pad 141 of the third die 300. The fourth back contact pad 154 of the second die 200 is electrically connected to the fourth front contact pad 151 of the third die 300. The third back contact pad 144 of the third die 300 is electrically connected to the third front contact pad 141 of the fourth die 400. The fourth back contact pad 154 of the third die 300 is electrically connected to the fourth front contact pad 151 of the fourth die 400.

The third front contact pad 141 of the first die 100 is electrically connected to a third bond wire 146 by a third bond 145. The third front contact pad 141 of the first die 100 therefore serves as an external pad. The third bond wire 146 is thereby electrically connected to the third internal pad 140 of the first die 100 and to the third internal pad 140 of the third die 300. The third bond wire 146 may be utilized to connect the chip stack 10 to an external electronic device, for example to a memory controller. The third bond wire 146 may be utilized to couple electronic signals in the first and third die 100, 300 and out of the first and third die 100, 300. The electronic signals may for example be clock enable signals.

The fourth front contact pad 151 of the first die 100 is electrically connected to a fourth bond wire 156 by a fourth bond 155. The fourth front contact pad 151 of the first die 100 therefore serves as an external pad. The fourth bond wire 156 is thereby electrically connected to the third internal pad 140 of the second die 200 and to the third internal pad 140 of the fourth die 400. The fourth bond wire 156 may be utilized to couple electronic signals in the second and the fourth die 200, 400 and out of the second and the fourth die 200, 400. The electronic signals may for example be clock enable signals.

FIG. 4 schematically depicts another section of the chip stack 10. In this section of the chip stack 10 each die 100, 200, 300, 400 comprises a fourth internal pad 160 arranged in the last metallic layer 140 of the respective die 100, 200, 300, 400. The fourth internal pad 160 of each die 100, 200, 300, 400 is electrically connected to electronic circuits integrated in the respective die 100, 200, 300, 400.

The redistribution layers 112 of the second, the third and the fourth die 200, 300, 400 and the redistribution layer 116 of the first die 100 each comprise a fifth front contact pad 161, a sixth front contact pad 171, a seventh front contact pad 181 and an eighth front contact pad 191. Each fifth front contact pad 161 extends through the insulator layer 113 of the respective die 100, 200, 300, 400 to provide an electrical connection to the fourth internal pad 160 of the respective die 100, 200, 300, 400. The fifth front contact pad 161 of each die 100, 200, 300, 400 is furthermore electrically connected to a third redistribution connection 162 arranged in the respective last metallic layer 114 of each die 100, 200, 300, 400. The sixth front contact pad 171 of each die 100, 200, 300, 400 is electrically connected to a fourth redistribution connection 172 arranged in the respective last metallic layer 114 of each die 100, 200, 300, 400. The seventh front contact pad 181 of each die 100, 200, 300, 400 is electrically connected to a fifth redistribution connection 182 arranged in the respective last metallic layer 114 of each die 100, 200, 300, 400. The eighth front contact pad 191 of each die 100, 200, 300, 400 is electrically connected to a sixth redistribution connection 192 arranged in the respective last metallic layer 114 of each die 100, 200, 300, 400.

The respective backside interconnect layer 115 arranged on the respective backside 111 of the first, the second and the third die 100, 200, 300 each comprises a fifth back contact pad 164, a sixth back contact pad 174, a seventh back contact pad 184 and an eighth back contact pad 194. The respective fifth back contact pad 164 of the first, the second and the third die 100, 200, 300 is electrically coupled to the third redistribution connection 162 of the respective die 100, 200, 300 by means of a fifth Through Silicon Via 163 extending through the respective die 100, 200, 300. Each respective sixth back contact pad 174 of the first, second and third die 100, 200, 300 is electrically connected to the fourth redistribution connection 172 of the respective die 100, 200, 300 by means of a sixth Through Silicon Via 172 extending through the respective die 100, 200, 300. Each respective seventh back contact pad 184 of the first, second and third die 100, 200, 300 is electrically connected to the fifth redistribution connection 182 of the respective die 100, 200, 300 by means of a seventh Through Silicon Via 183 extending trough the respective die 100, 200, 300. Each respective eighth back contact pad 194 of the first, second and third die 100, 200, 300 is electrically connected to the sixth redistribution connection 192 of the respective die 100, 200, 300 by means of an eighth Through Silicon Via 193 extending through the respective die 100, 200, 300.

The fourth die 400 may also comprise a fifth Through Silicon Via 163 electrically connected to the third redistribution connection 162 of the fourth die 400, a sixth Through Silicon Via 173 electrically connected to the fourth redistribution connection 172 of the fourth die 400, seventh Through Silicon Via 183 electrically connected to the fifth redistribution connection 182 of the fourth die 400 and an eighth Through Silicon Via 193 electrically connected to the sixth redistribution connection 192 of the fourth die 400.

Each respective fifth back contact pad 164 of the first, second and third die 100, 200, 300 is electrically connected to the eighth front contact pad 191 of the next upper die 200, 300, 400. Each respective sixth back contact pad 174 of the first, second and third die 100, 200, 300 is electrically connected to the fifth front contact pad 161 of the next upper die 200, 300, 400. Each respective seventh back contact pad 184 of the first, second and third die 100, 200, 300 is electrically connected to the sixth front contact pad 171 of the next upper die 200, 300, 400. Each respective eighth back contact pad 194 of the first, second and third die 100, 200, 300 is electrically connected to the seventh front contact pad 181 of the next upper die 200, 300, 400.

The fifth, sixth, seventh, eighth back contact pad 164, 174, 184, 194 of the first die 100 is electrically connected to the eighth, fifth, sixth, seventh front contact pad 191, 161, 171, 181 of the second die 200, respectively. The fifth, sixth, seventh, eights back contact pad 164, 174, 184, 194 of the second die 200 is electrically connected to the eighth, fifth, sixth, seventh front contact pad 191, 161, 171, 181 of the third die 300, respectively.

The fifth, sixth, seventh, eighth back contact pad 164, 174, 184, 194 of the third die 300 is electrically connected to the eighth, fifth, sixth, seventh front contact pad 191, 161, 171, 181 of the fourth die 400, respectively.

The fifth front contact pad 161 of the first die 100 is electrically connected to a fifth bond wire 166 by a fifth bond 165. The fifth front contact pad 161 of the first die 100 therefore serves as an external pad. The sixth front contact pad 171 of the first die 100 is electrically connected to a sixth bond wire 176 by a sixth bond 175. The sixth front contact pad 171 of the first die 100 therefore serves as an external pad. The seventh front contact pad 181 of the first die 100 is electrically connected to a second bond wire 186 by a seventh bond 185. The seventh front contact pad 181 of the first die 100 therefore serves as an external pad. The eighth front contact pad 191 of the first die 100 is electrically connected to an eighth bond wire 196 by an eighth bond 195. The eighth front contact pad 191 of the first die 100 therefore serves as an external pad. The fifth, sixth, seventh, eighth bond wire 166, 176, 186, 196 may be utilized to connect the chip stack 10 to an external electronic device, for example to a memory controller, and to couple electronic signals in the dies 100, 200, 300, 400 and out of the dies 100, 200, 300, 400.

The fifth bond wire 166 is electrically connected to the fourth internal pad 160 of the first die 100 and may be used to couple electronic signals in the first die 100 and out of the first die 100. The sixth bond wire 176 is electrically connected to the fourth internal pad 160 of the second die 200 and may be used to couple electronic signals in the second die 200 and out of the second die 200. The seventh bond wire 186 is electrically connected to the fourth internal pad 160 of the third die 300 and may be used to couple electronic signals in the third die 300 and out of the third die 300. The eighth bond wire 196 is electrically connected to the fourth internal pad 160 of the fourth die 400 and may be used to couple electronic signals in the fourth die 400 and out of the fourth die 400. The electronic signals may for example be chip select signals or calibrations signals. Each die 100, 200, 300, 400 may be provided with an independent electronic signal via the fifth, the sixth, the seventh and the eighth bond wire 166, 176, 186, 196.

Since the electronic signal applied to the fifth bond wire 166 is only utilized in the first die 100, the third redistribution connection 162, the fifth Through Silicon Via 163 and the fifth back contact pad 164 of the first die 100, the eighth front contact pad 191, the sixth redistribution connection 192, the eighth Through Silicon Via 193 and the eighth back contact pad 194 of the second die 200, the seventh front contact pad 181, the fifth redistribution connection 182, the seventh Through Silicon Via 183 and the seventh back contact pad 184 of the third die 300, and the sixth front contact pad 171, the fourth redistribution connection 172 and the sixth Through Silicon Via 173 of the fourth die 400 may be omitted.

Since the electronic signal applied to the sixth bond wire 176 is only utilized in the second die 200, the third redistribution connection 162, the fifth Through Silicon Via 163 and the fifth back contact pad 164 of the second die 200, the eighth front contact pad 191, the sixth redistribution connection 192, the eighth Through Silicon Via 193 and the eighth back contact pad 194 of the third die 300, and the seventh front contact pad 181, the fifth redistribution connection 182 and the seventh Through Silicon Via 183 of the fourth die 400 may be omitted.

Since the electronic signal applied to the seventh bond wire 186 is only utilized in the third die 300, the third redistribution connection 162, the fifth Through Silicon Via 163 and the fifth back contact pad 164 of the third die 300, and the eighth front contact pad 191, the sixth redistribution connection 192 and the eighth Through Silicon Via 193 of the fourth die 400 may be omitted.

Since the electronic signal applied to the eighth bond wire 196 is only utilized in the fourth die 400, the third redistribution connection 162 and the fifth Through Silicon Via 163 of the fourth die 400 may be omitted.

By omitting the listed components, the chip stack 10 may be simplified. If the listed components are not omitted, the first, second, third and fourth die 100, 200, 300, 400 may each comprise an identical design up to the respective last metallic layer 114 or up to the respective redistribution layer 112, 110. Furthermore, if the listed components are not omitted, each of the fifth, sixth, seventh and eighth bond wires 166, 176, 186, 196 is connected to the same number of contact pads, redistribution connections and Through Silicon Vias. This may lead to a similar electric load connected to each bond wires 166, 176, 186, 196.

Figure 5:
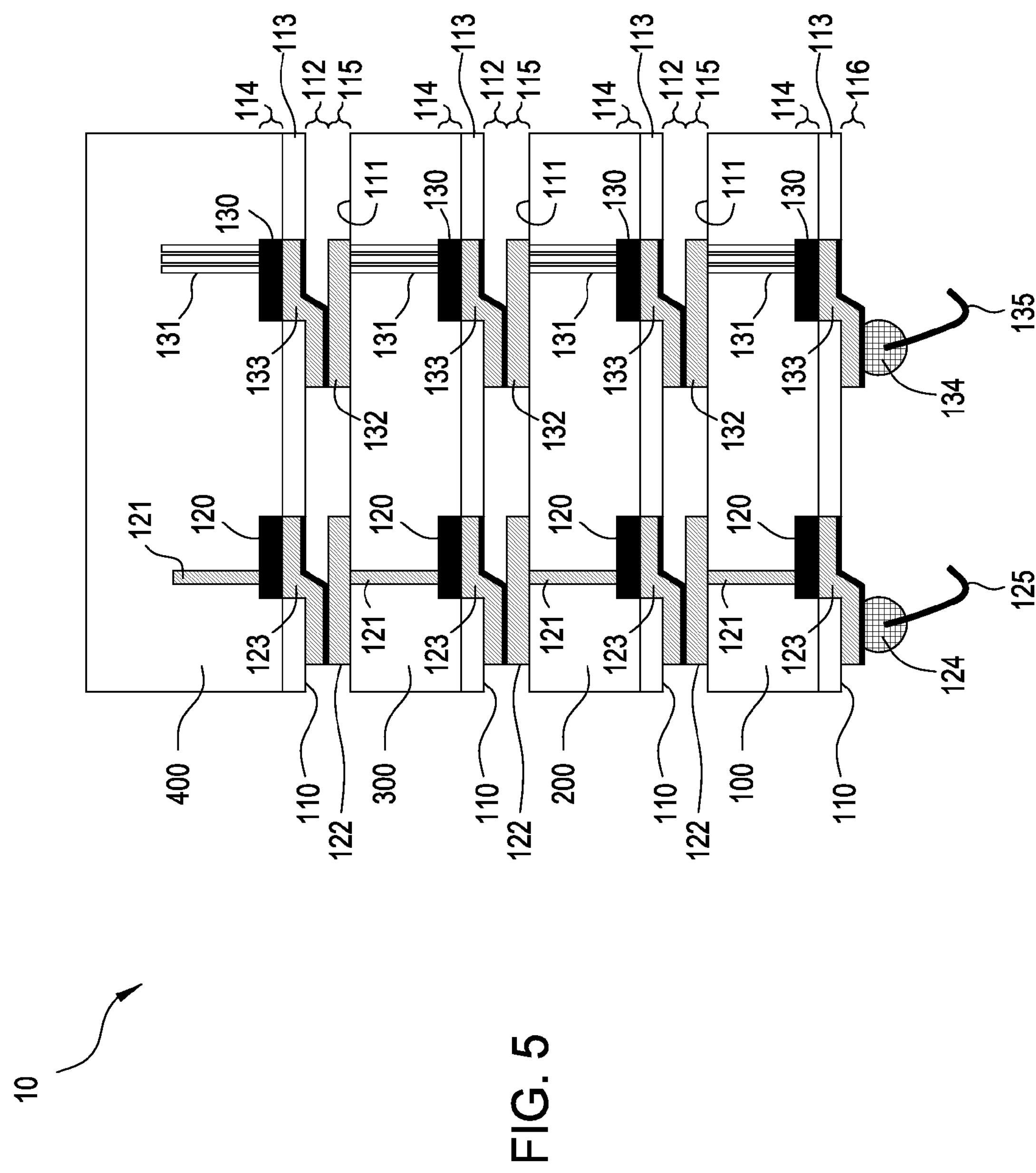
FIG. 5 schematically shows a section of a chip stack.

FIG. 5 depicts alternative implementations of the sections of the chip stack 10 depicted in FIGS. 1 and 2. In the implementation of FIG. 5, the redistribution layer 116 of the first die 100 is identical to the redistribution layers 112 of the second, the third and the fourth dies 200, 300, 400. The redistribution layer 116 comprises a first front contact pad 123 and a second front contact pad 133. The first front contact pad 123 extends through an opening in the insulator layer 113 of the first die 100 to provide an electrical connection to the first internal pad 120 of the first die 100. The second front contact pad 133 of the first die 100 extends through an opening in the insulator layer 113 of the first die 100 to provide an electrical connection to the second internal pad 130 of the first die 100. The first bond wire 125 is electrically connected to the first front contact pad 123 of the first die 100 by the first bond 124. The first front contact pad 123 of the first die 100 therefore serves as an external pad. The second bond wire 135 is electrically connected to the second front contact pad 133 of the first die 100 by the second bond 134. The second front contact pad 133 of the first die 100 therefore serves as an external pad.

In the implementation of FIG. 5, the first, second, third and fourth dies 100, 200, 300, 400 are identical up to the respective last metallic layer 114 and also comprise identical redistribution layers 112, 116. The first, second and third dies 100, 200, 300 also comprise identical backside interconnect layers 115. The first, second and third dies 100, 200, 300 may have been thinned before creating the respective backside interconnect layers 115. The fourth die 400 may or may not have been thinned as well.

The chip stack 10 may not necessarily comprise all the sections depicted in FIGS. 1 to 5. All dies 100, 200, 300, 400 used in the chip stack 10 may comprise an identical design up to the respective last metallic layer 114 of the dies 100, 200, 300, 400. The first, second and third dies 100, 200, 300 may also comprise identical backside interconnect layers 115. The fourth die 400 may also comprise a backside interconnect layer 115.

The second, third and fourth dies 200, 300, 400 may comprise identical respective first redistribution layers 112. The second redistribution layers 116 of the first die 100 may or may not be identical to the respective first redistribution layers 112 of the second, third and fourth dies 200, 300, 400.

The electronic circuits integrated in the first, second, third and fourth die 100, 200, 300, 400 may be designed such that the dies 100, 200, 300, 400 may be used as stand alone integrated circuit dies. To this end, the first Through Silicon Via 121, the first back contact pads 122, the second Through Silicon Vias 131, the second back contact pads 132, the first redistribution connections 142, the fourth Through Silicon Vias 153, the fourth back contact pads 154, the fourth front contact pads 151, the second redistribution connections 152, the third Through Silicon Vias 143, the third back contact pads 144, the third redistribution connections 162, the fifth Through Silicon Vias 163, the fifth back contact pads 164, the sixth front contact pads 171, the fourth redistribution connections 172, the sixth Through Silicon Vias 173, the sixth back contact pads 174, the seventh front contact pads 181, the fifth redistribution connections 182, the seventh Through Silicon Vias 183, the seventh back contact pads 184, the eighth front contact pads 191, the sixth redistribution connections 192, the eighth Through Silicon Vias 193, and the eighth back contact pads 194 may be omitted.

The listed components may later be added to the design of the electronic circuits integrated in the dies 100, 200, 300, 400 to make the dies 100, 200, 300, 400 usable in a chip stack. The listed components may be added to the design of the electronic circuits integrated in the dies 100, 200, 300, 400 without major layout changes and without a full-level re-design. To this end, the original design may provide free space for adding the third, fourth, fifth, sixth, seventh and eighth Through Silicon Vias 143, 153, 163, 173, 183, 193. Since the first and second Through Silicon Vias 121, 131 are provided below the first and second internal pads 120, 130, respectively, they do not require additional space.

Figure 6:
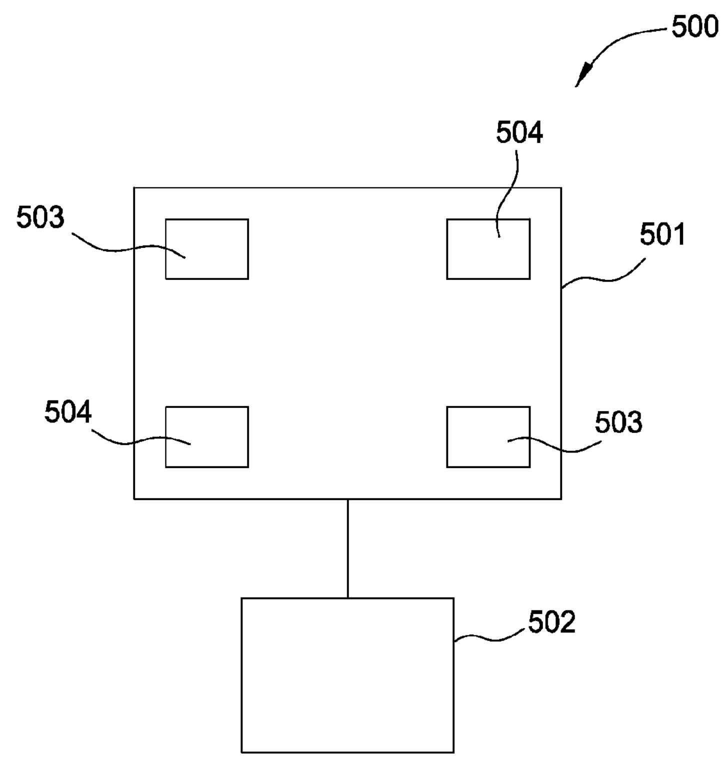
FIG. 6 schematically shows a system for designing an integrated circuit.

FIG. 6 schematically shows a system 500 for designing an integrated circuit. The system 500 comprises a computer 502 and a visual representation 501 of an integrated circuit design. The visual representation may for example be displayed on a screen of the computer 502.

The visual representation 501 of the integrated circuit design comprises two placeholders 503 for a Through Silicon Via and two positions 504 for an internal pad in a last metallic layer of the integrated circuit design. The space of the two placeholders 503 remains free. The integrated circuit design of FIG. 6 may be used for an integrated circuit of a stand-alone semiconductor chip.

Figure 7:
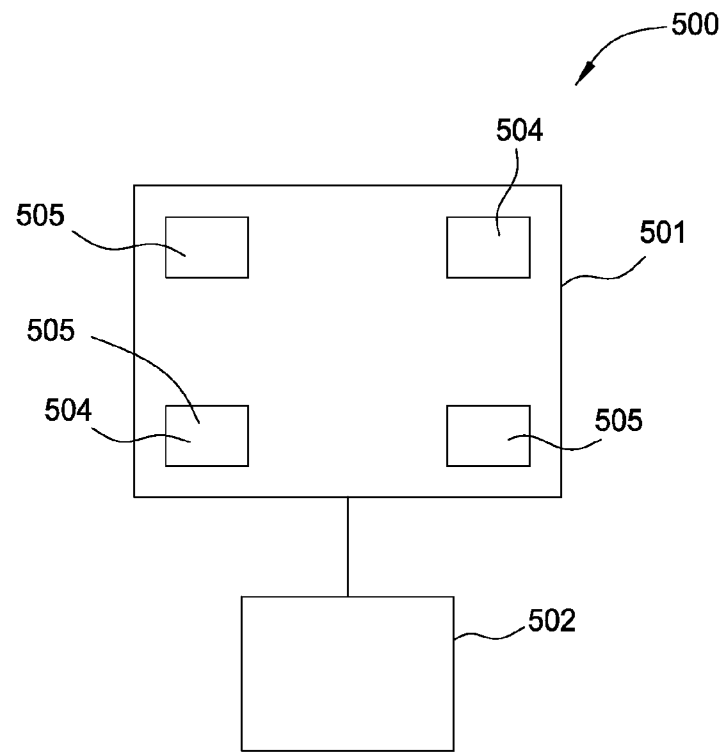
FIG. 7 schematically shows a system for designing an integrated circuit.

FIG. 7 schematically shows the system 500 for designing an integrated circuit after the execution of further processing steps. The placeholders 503 for a Through Silicon Via have been replaced with positions 505 for a Through Silicon Via. Additionally, a position 505 for a Through Silicon Via has been created at one of the positions 504 for an internal pad. The integrated circuit design of FIG. 7 may be used for an integrated circuit of a chip for a chip stack.

The preceding description only describes advantageous exemplary embodiments of the invention. The features disclosed therein and the claims and the drawings can therefore be essential for the realization of the invention in its various embodiments both individually and in any combination. While the foregoing is directed to embodiments of the present invention other and further embodiments of this invention may be devised without departing from the basic scope of the invention. The scope of the present invention being determined by the claims that follow.

What is claimed is:

1. An electronic device, comprising:
- a stack of a plurality of semiconductor chips arranged one on top of another, the stack comprising:
  - a first semiconductor chip of the plurality of semiconductor chips arranged at a bottom of the stack, the first semiconductor chip comprising
  - a first internal pad electrically connected to a first electronic circuit in the first semiconductor chip, the first internal pad configured to receive an electronic signal from an external electronic circuit;
  - a second semiconductor chip of the plurality of semiconductor chips disposed in the stack above the first semiconductor chip, the second semiconductor chip comprising a second internal pad connected to a second electronic circuit in the second semiconductor chip;
  - a redistribution layer arranged on the second semiconductor chip, the redistribution layer comprising a contact pad and an insulator layer, wherein a first portion of the contact pad is disposed on a front side of the insulator layer facing the first semiconductor chip and a second portion of the contact pad is disposed in an opening of the insulator layer; and
  - a first Through Silicon Via directly connected to the first internal pad, the first Through Silicon Via and contact pad electrically coupling the first and second internal pads.

2. The electronic device according to claim 1, further comprising a redistribution layer of the first semiconductor chip comprising external pads, wherein one of the external pads is coupled to the first internal pad.

3. The electronic device according to claim 2,
- wherein the redistribution layer of the first semiconductor chip comprises one external pad for each of a plurality of electronic signals, the plurality of electronic signals including the received electronic signal,
- wherein the first and second internal pads are electrically connected to respective external pads of the redistribution layer of the first semiconductor chip.

4. The electronic device according to claim 3,
- wherein at least two of the external pads are each electrically connected to more than one internal pad.

5. The electronic device according to claim 3,
- wherein the electronic circuit in the second semiconductor chip is configured to receive at least one of the plurality of electronic signals, the at least one electronic signal comprising at least one of: a chip select signal, a ZQ calibration signal, a clock enable signal, an on-die termination signal, and a voltage supply signal.

6. The electronic device according to claim 2, further comprising a third semiconductor chip of the plurality of semiconductor chips arranged above the second semiconductor chip, the third semiconductor chip comprising a third internal pad, wherein the first, second, and third internal pads are electrically connected to the one external pad, wherein the electrical connection between the third internal pad and the same external pad is routed through intermediary semiconductor chips by a plurality of Through Silicon Vias including the first Though Silicon Via, and wherein each of the plurality of Through Silicon Vias is arranged below the third internal pad.

7. The electronic device according to claim 6, wherein the external electronic circuit is a memory controller, wherein the electronic signal is received from the memory controller on the first, second, and third internal pads.

8. The electronic device according to claim 6, wherein the second and third internal pads are coupled to a respective electronic circuit configured to receive the electronic signal, wherein the electronic signal is at least one of: a column address signal, a clock signal, a reset signal, a reference voltage signal, and a power supply signal.

9. The electronic device according to claim 2, wherein a design layout defining an entire layout of each of the plurality of semiconductor chips is the same except for a last metallic layer in each of the plurality of semiconductor chips that is closest to the bottom of the stack.

10. The electronic device according to claim 2, further comprising:

a third semiconductor chip of the plurality of semiconductor chips arranged above the second semiconductor chip; and a redistribution layer disposed on the third semiconductor chip, wherein a layout for the respective redistribution layers of the second and third semiconductor layers is the same.

11. The electronic device according to claim 2, wherein each of the plurality of semiconductor chips comprises a respective redistribution layer, wherein a layout for each of the respective redistribution layers of the plurality of semiconductor chips is the same.

12. An electronic device, comprising:

a stack of a plurality of semiconductor chips arranged one on top of another, the stack comprising:

a first semiconductor chip of the plurality of semiconductor chips arranged at a bottom of the stack;

a redistribution layer arranged on the first semiconductor chip, the redistribution layer comprising external pads, wherein the first semiconductor chip comprises a first internal pad electrically connected to both an electronic circuit in the first semiconductor chip and a first one of the external pads;

a second semiconductor chip of the plurality of semiconductor chips disposed in the stack above the first semiconductor chip, wherein a second one of the external pads is electrically connected to a second internal pad in the second semiconductor chip, wherein the second internal pad is connected to an electronic circuit in the second semiconductor chip, wherein the second external pad is electrically connected to the second internal pad by a first via extending, along a center axis, through an upper and a lower surface of the first semiconductor chip, and wherein the second external pad is not electrically connected to the first internal pad in the first semiconductor chip; and a routing layer in the second semiconductor chip comprising an interconnect that routes an electrical signal received from the first via to a second via extending, along a center axis, through the lower surface and an upper surface of the second semiconductor chip, wherein the center axis of the first via is unaligned with the center axis of the second via.

13. The electronic device of claim 12, wherein each of the external pads is electrically connected to exactly one internal pad.

14. An electronic device, comprising:

a stack of a plurality of semiconductor chips arranged one on top of another, the stack comprising:

a first semiconductor chip of the plurality of semiconductor chips arranged at a bottom of the stack, a redistribution layer on the first semiconductor chip, the redistribution layer comprising external pads;

a second semiconductor chip of the plurality of semiconductor chips disposed in the stack above the first semiconductor chip, wherein a first internal pad in the second semiconductor chip is electrically connected to both a first one of the external pads by a first via and an electronic circuit in the second semiconductor chip; and a third semiconductor chip of the plurality of semiconductor chips disposed in the stack above the first and second semiconductor chips, wherein a second internal pad in the third semiconductor chip is electrically connected to both a second one of the external pads by at most two vias that are different from the first via and an electronic circuit in the third semiconductor chip, wherein each of the two vias is defined by a respective center axis, and wherein one of the two vias is in the first semiconductor chip and one of the two vias is in the second semiconductor chip.

15. The electronic device of claim 14, wherein the first and second internal pads are not electrically connected.

16. The electronic device of claim 14, wherein each of the external pads is electrically connected to exactly one internal pad.

17. The electronic device of claim 12, wherein a design layout defining an entire layout of each of the plurality of semiconductor chips is the same except for a last metallic layer in each of the plurality of semiconductor chips that is closest to the bottom of the stack.

18. The electronic device of claim 14, wherein a design layout defining an entire layout of each of the plurality of semiconductor chips is the same except for a last metallic layer in each of the plurality of semiconductor chips that is closest to the bottom of the stack.

19. The electronic device according to claim 1, the stack of a plurality of semiconductor chips comprises multi-rank memory devices.

* * * * *